United States Patent
Nakano et al.

(10) Patent No.: US 7,186,439 B2
(45) Date of Patent: Mar. 6, 2007

(54) METHOD OF MANUFACTURING ORGANIC ELECTROLUMINESCENT DISPLAY

(75) Inventors: Shingo Nakano, Gifu (JP); Hiroshi Kanno, Osaka (JP); Masaya Nakai, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/378,929

(22) Filed: Mar. 5, 2003

(65) Prior Publication Data
US 2003/0170380 A1 Sep. 11, 2003

(30) Foreign Application Priority Data
Mar. 5, 2002 (JP) ............................. 2002-059540

(51) Int. Cl.
*B05D 5/06* (2006.01)
(52) U.S. Cl. .................... 427/66; 427/68; 427/69; 427/70
(58) Field of Classification Search .................. 427/66, 427/68, 69, 70
See application file for complete search history.

(56) References Cited

U.S. PATENT DOCUMENTS

| | | | | |
|---|---|---|---|---|
| 5,518,824 A | * | 5/1996 | Funhoff et al. | 428/690 |
| 5,701,055 A | * | 12/1997 | Nagayama et al. | 313/504 |
| 5,902,688 A | * | 5/1999 | Antoniadis et al. | 428/690 |
| 6,130,001 A | * | 10/2000 | Shi et al. | 428/690 |
| 6,244,212 B1 | * | 6/2001 | Takacs et al. | 118/723 EB |
| 6,517,996 B1 | * | 2/2003 | Chao et al. | 430/321 |
| 6,537,607 B1 | * | 3/2003 | Swanson | 427/66 |
| 6,579,422 B1 | * | 6/2003 | Kakinuma | 204/192.13 |
| 6,582,756 B1 | * | 6/2003 | Antoniadis et al. | 427/66 |
| 6,623,097 B2 | * | 9/2003 | Okada et al. | 347/21 |
| 6,641,674 B2 | * | 11/2003 | Peng | 118/727 |
| 6,869,636 B2 | * | 3/2005 | Chung | 427/66 |
| 2001/0006827 A1 | * | 7/2001 | Yamazaki et al. | 438/30 |
| 2002/0009538 A1 | * | 1/2002 | Arai | 427/66 |

(Continued)

FOREIGN PATENT DOCUMENTS

JP    56-160964    12/1981

(Continued)

OTHER PUBLICATIONS

Dispatch No. 032405; Decision of Refusal; Patent Application No. 2002-059540; Feb. 1, 2005.

*Primary Examiner*—Bret Chen
(74) *Attorney, Agent, or Firm*—McDermott Will & Emery LLP

(57) ABSTRACT

A method of manufacturing an organic EL display in which organic EL devices are prevented from being promoted in degradation by interfaces that occur between the hole transporting layer and the luminescent layer and between the luminescent layer and the electron transporting layer during the formation of the organic EL devices. The material of the luminescent layer is evaporated from a first evaporation source. At that time, the first evaporation source is moved from one end of a glass substrate to the other. Consequently, the luminescent layer is formed evenly on the glass substrate. After the formation of the luminescent layer is completed, the material of the electron transporting layer is evaporated from a second evaporation source. The second evaporation source is moved as if the first evaporation source is, whereby the electron transporting layer is formed evenly.

10 Claims, 4 Drawing Sheets

U.S. PATENT DOCUMENTS

| | | | |
|---|---|---|---|
| 2002/0076847 A1* | 6/2002 | Yamada et al. | 438/34 |
| 2003/0010288 A1* | 1/2003 | Yamazaki et al. | 118/715 |
| 2003/0203100 A1* | 10/2003 | Himeshima et al. | 427/66 |
| 2003/0228417 A1* | 12/2003 | Nishikawa et al. | 427/248.1 |
| 2004/0261709 A1* | 12/2004 | Sakata | 118/718 |
| 2005/0005848 A1* | 1/2005 | Yamazaki et al. | 118/719 |

FOREIGN PATENT DOCUMENTS

| | | |
|---|---|---|
| JP | 11-045779 | 2/1999 |
| JP | 2000-91425 A | 3/2000 |
| JP | 2001-238167 A | 8/2001 |
| JP | 2001-247959 A | 9/2001 |
| JP | 2002-025770 A | 1/2002 |
| JP | 2002-322556 A | 11/2002 |
| JP | 2003-133067 A | 5/2003 |

* cited by examiner

METHOD OF MANUFACTURING ORGANIC ELECTROLUMINESCENT DISPLAY

BACKGROUND OF THE INVENTION

1. Field of the Invention

The present invention relates to a method of manufacturing an organic electroluminescent display.

2. Description of the Related Art

Organic electroluminescent displays (hereinafter, also referred to simply as "organic EL displays") are expected as alternatives to the currently prevailing liquid crystal displays, and are under development for practical application. In particular, active matrix type organic EL displays having thin film transistors (TFTs) as switching elements are regarded as the mainstream of next-generation flat displays.

FIG. 1 is a plan view of an organic EL display having organic electroluminescent devices (hereinafter, also referred to simply as "organic EL devices") for emitting luminescence in red, green, and blue with their respective pixels. FIG. 1 schematically shows pixel areas of the three colors mentioned above. Starting from the left, there are provided a red pixel Rpix having a red luminescent layer, a green pixel Gpix having a green luminescent layer, and a blue pixel Bpix having a blue luminescent layer.

Each single pixel is formed in an area surrounded by gate signal lines 51 and drain signal lines 52. A first TFT 130, a switching element, is formed near the upper left intersection of the signal lines. A second TFT 140 for driving the organic EL device is formed near the center. Organic EL devices are formed discretely in areas where hole injecting electrodes 12 are formed.

In general, an organic EL display comprises organic EL devices in which electrons and holes are injected into a luminescent layer from an electron injecting electrode and a hole injecting electrode, respectively. The electrons and holes recombine with each other at the interface between the luminescent layer and a hole transporting layer, near the interface, or inside the luminescent layer, thereby bringing organic molecules into an excited state. These organic molecules return from the excited state to a ground state with fluorescence emission.

Here, in forming the organic EL devices, the material of the luminescent layer can be selected to obtain organic EL devices for emitting luminescence in appropriate colors. Besides, such organic EL devices can be selected appropriately to achieve a color display.

In many cases, these organic EL devices are formed by vacuum evaporation. Moreover, in view of productivity, the organic EL devices are often manufactured by a batch method. When organic EL devices are manufactured by a batch method, the luminescent layers and the electron transporting layers are typically formed in different formation chambers of a system. This lengthens the time that elapses from the formation of the luminescent layers to the formation of the electron transporting layers thereon. Consequently, impurities responsible for degradation of the organic EL devices, such as water molecules and oxygen molecules, can get into the interfaces between the luminescent layers and the electron transporting layers.

SUMMARY OF THE INVENTION

The present invention has been achieved in view of the foregoing. It is thus an object thereof to provide a method of manufacturing an organic EL display for suppressing degradation of the organic EL devices.

One of the aspects of the present invention relates to a method of manufacturing an organic electroluminescent display. This fabrication method is one for manufacturing an organic EL display having an organic EL device, in which a luminescent layer and an electron transporting layer to be arranged on the luminescent layer are formed in succession.

Another aspect of the present invention also relates to a method of manufacturing an organic electroluminescent display. This fabrication method is one for manufacturing an organic EL display having organic EL devices for emitting luminescence in a plurality of colors, in which a luminescent layer and an electron transporting layer to be arranged on the luminescent layer are formed in an identical formation chamber in succession with respect to each color.

The electron transporting layer may be formed within ten minutes after the formation of the luminescent layer. The luminescent layer and the electron transporting layer to be arranged on the luminescent layer maybe formed in vacuum by evaporation. Here, a first moving evaporation source for retaining and evaporating material of the luminescent layer and a second moving evaporation source for retaining and evaporating material of the electron transporting layer are placed below a substrate for the luminescent layer and the electron transporting layer to be formed on. The first and second moving evaporation sources are relatively moved parallel with a surface of the substrate for the luminescent layer and the electron transporting layer to be formed on while the luminescent layer and the electron transporting layer are formed in succession.

Moreover, the first and second moving evaporation sources may be opposed to each other below the substrate so as to be capable of movement from one end of the substrate to the other. Here, the luminescent layer and the electron transporting layer are formed in succession by evaporating the materials retained in the first and second moving evaporation sources while the respective moving evaporation sources are moved by turns. Furthermore, the numbers of scans of the first and second moving evaporation sources may be equal to or below five each, with a process of moving the first and second moving evaporation sources from one end of the substrate to the other as a single unit of scan. The numbers of scans of the first and second moving evaporation sources may be even numbers, respectively. The first and second moving evaporation sources may be returned to their respective initial positions when the scans of the first and second moving evaporation sources are completed.

BRIEF DESCRIPTION OF THE DRAWINGS

FIGS. 3(a) and 3(b) are diagrams schematically showing the physical relationship between evaporation sources consisting of a plurality of container cells each and the substrate for organic materials to be evaporated on;

DETAILED DESCRIPTION OF THE PREFERRED EMBODIMENT

The invention will now be described based on preferred embodiments which do not intend to limit the scope of the present invention but exemplify the invention. All of the features and the combinations thereof described in the embodiment are not necessarily essential to the invention.

In the present embodiment, organic EL devices are formed by vacuum evaporation. As described above, in a typical system for manufacturing organic EL devices by a batch method, the luminescent layers and the electron transporting layers are formed in different formation chambers. In the present embodiment, the luminescent layers and the electron transporting layers are formed in an identical formation chamber in succession.

Figure 1:
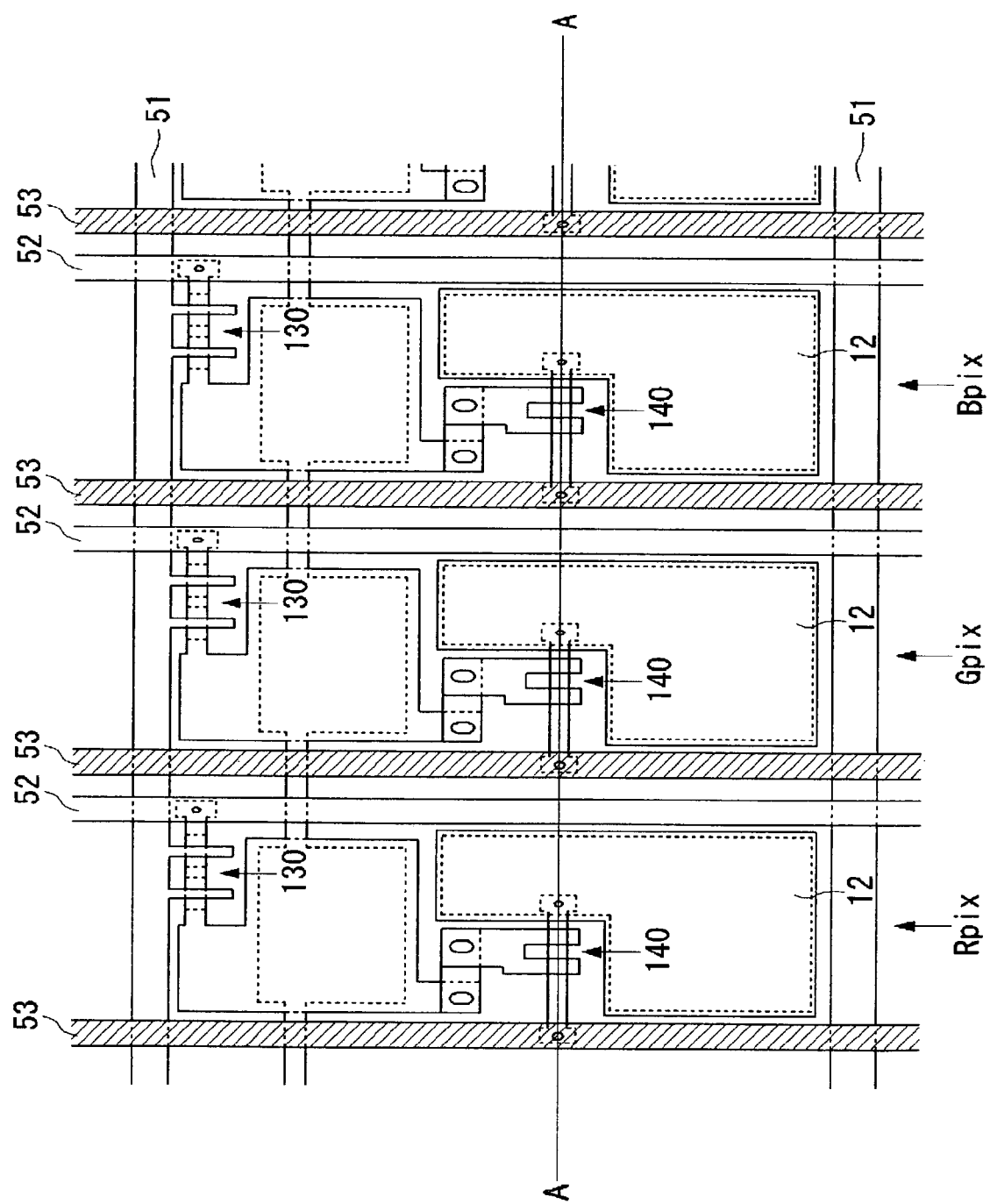
FIG. 1 is a plan view of an active matrix type organic EL display, showing the areas of red, green, and blue, three pixels in particular.
Figure 2:
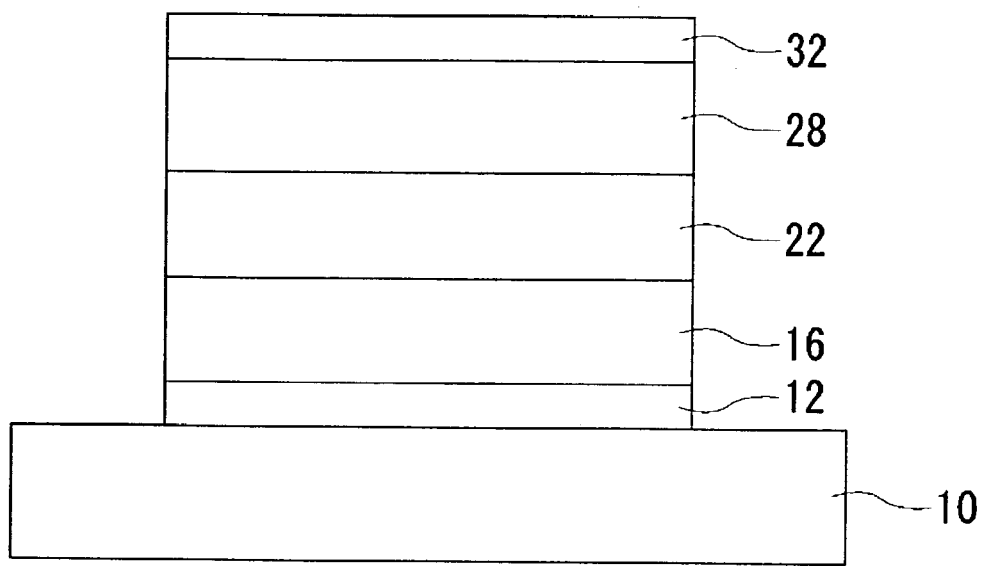
FIG. 2 is a sectional view showing a typical structure of an organic EL device.

FIG. 2 schematically shows a representative sectional structure of a single pixel of the organic EL display shown in FIG. 1. A hole injecting electrode 12, a hole transporting layer 16, a luminescent layer 22, an electron transporting layer 28, and an electron injecting electrode 32 are laminated on a glass substrate 10.

The hole injecting electrode 12 is made of such material as indium tin oxide (ITO), tin oxide ($SnO_2$), or indium oxide ($In_2O_3$).

The hole transporting layer 16 is made of such material as N,N'-di(naphthalene-1-yl)-N,N'-diphenyl-benzidine, specified with Formula 1, 4,4',4''-tris(3-methylphenylphenylamino)triphenylamine (MTDATA), or N,N'-diphenyl-N,N'-di(3-methylphenyl)-1,1'-biphenyl-4,4'-diamine, specified with Formula 3.

[Formula 1]

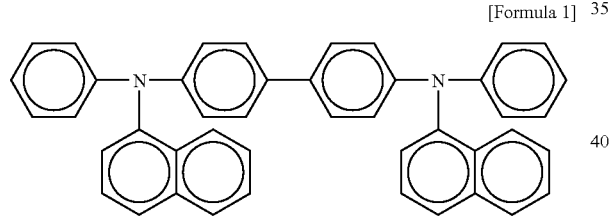

[Formula 2]

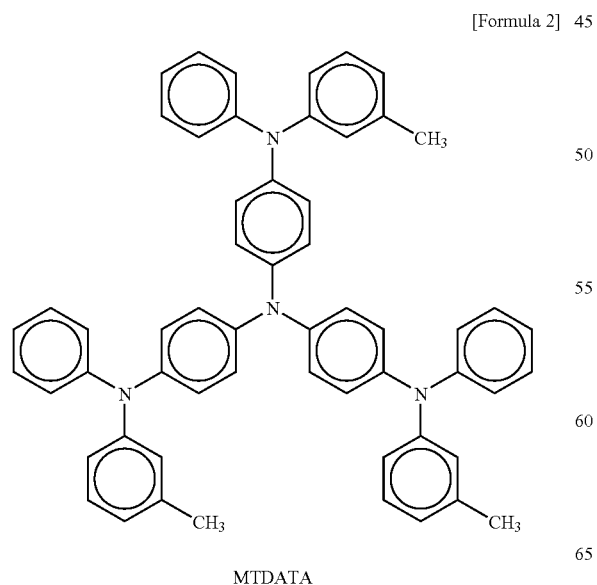

MTDATA

[Formula 3]

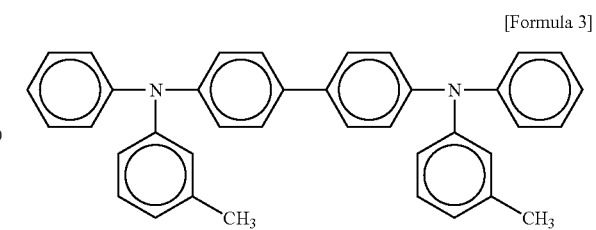

The luminescent layer 22 has such a host as an aluminum-quinoline complex (Alq3) or a bis(benzo-quinolinato) beryllium complex (BeBq2).

[Formula 4]

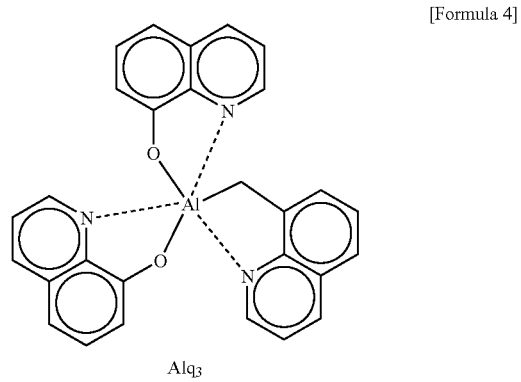

Alq3

[Formula 5]

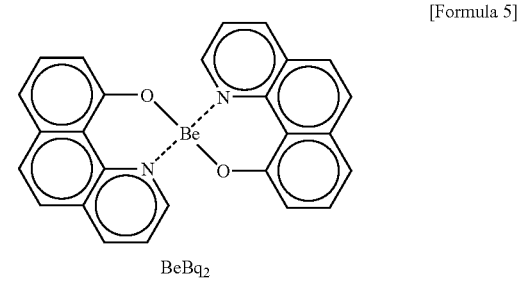

BeBq2

In general, organic EL devices having luminescent layers containing a chelate-metal complex have a problem in emitting luminescence of short-wavelength color, or blue in particular. Thus, luminescent layers for emitting blue luminescence often use a host of such material as acetone and its derivatives, including tert-butyl-substituted dinaphthylanthracene, specified with Formula 6, disclosed in Japanese Unexamined Patent Application Publication No. 2002-25770, and distilbenzene and its derivatives.

[Formula 6]

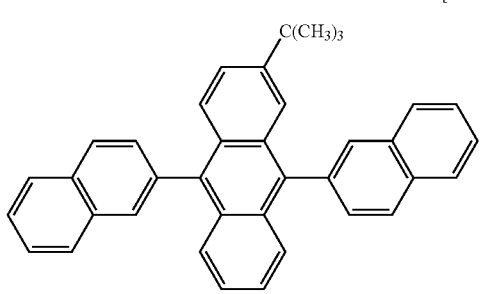

The luminescent layer 22, having a chelate-metal complex mentioned above or a fused polycyclic aromatic compound as its host, is doped with such a dopant as rubrene, quinacridone, and derivatives thereof for desired luminescence characteristics. The electron transporting layer 28 is made of such material as Alq3 and BeBq2. The electron injecting electrode 32 is made of such material as an aluminum alloy containing a trace quantity of Li (AlLi), a magnesium indium alloy (MgIn), or a magnesium silver alloy (MgAg). Alternatively, the electron injecting electrode 32 may be an electrode of double-layer structure in which a lithium fluoride layer and an aluminum layer are formed in this order on the side to contact with the electron transporting layer 28.

[Formula 7]

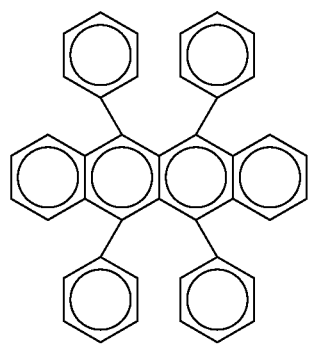

Rubrene

[Formula 8]

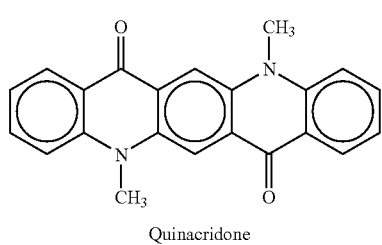

Quinacridone

Figure 3A:
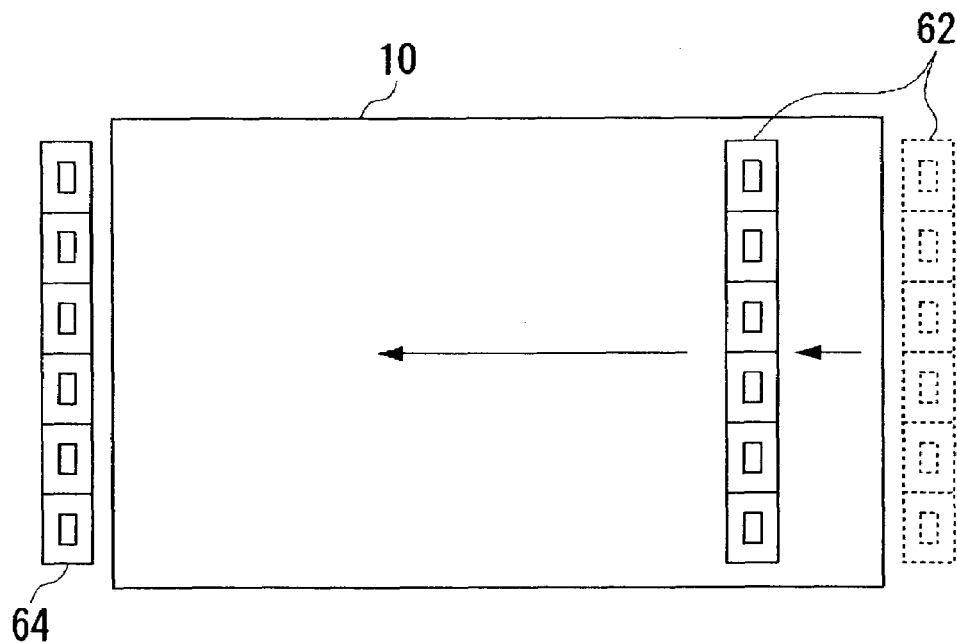
Figure 3B:
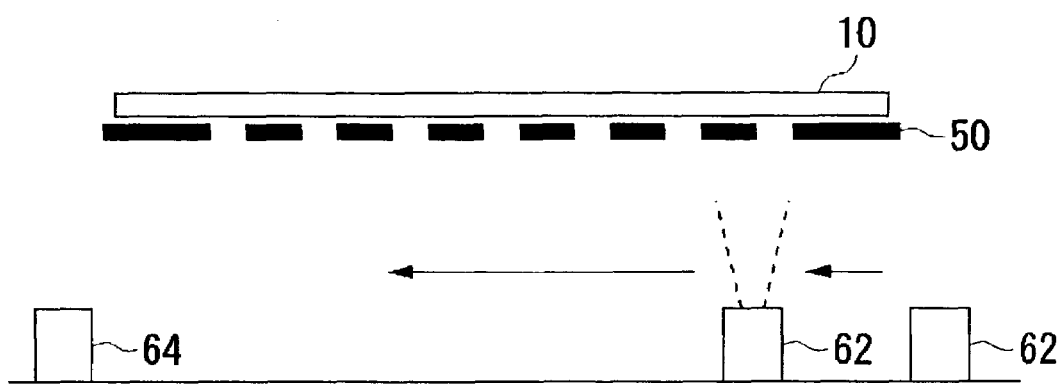

FIGS. 3(a) and 3(b) schematically show the physical relationship between the substrate and evaporation sources when organic materials are evaporated on the substrate by the method of manufacturing an organic EL device according to the present embodiment. FIG. 3(a) is a plan view taken from above. FIG. 3(b) is a side view taken from a side. Two moving evaporation sources, or a first evaporation source 62 for retaining and evaporating the material of the luminescent layer and a second evaporation source 64 for retaining and evaporating the material of the electron transporting layer, are opposed away from each other below the glass substrate 10. These two moving evaporation sources each have six quartz container cells connected to one another. The container cells are provided with an electric heater each. The electric heaters heat the container cells so that the materials evaporate from the top openings. The openings are configured closable, so that they are opened only when the materials retained in the evaporation sources are to be evaporated. This can avoid cross contamination of the materials.

Here, a hole transporting layer is laminated on the glass substrate 10. A metal mask 50 is situated so that electron transporting layers and luminescent layers corresponding to a desired color are formed in predetermined areas on the glass substrate 10. The position of this metal mask 50 can be adjusted appropriately to form organic layers of each color selectively.

Initially, the material of the luminescent layer is evaporated from the first evaporation source 62. At that time, the first evaporation source 62 is moved from one end of the glass substrate 10 to the other. Consequently, the luminescent layer is formed evenly on the glass substrate 10. After the formation of the luminescent layer is completed, the material of the electron transporting layer is then evaporated from the second evaporation source 64. The second evaporation source 64 is also moved as if the first evaporation source 62 is, whereby the electron transporting layer is formed evenly. Here, the process from one end of the glass substrate 10 to the other is regarded as a single unit of scan. A reciprocation thus counts two in the number of scans. In general, the numbers of scans are set in units of reciprocations, or at even numbers, because of the fabrication step in which the moving evaporation sources are returned to their initial positions.

The numbers of scans of the first evaporation source 62 and the second evaporation source 64 are determined by the evaporation rates of the luminescent layer and the electron transporting layer and the thicknesses of the respective layers. As the numbers of scans increase, however, the interfaces occurring in the luminescent layer and the electron transporting layer increase accordingly. These interfaces adsorb impurities which cause degradation of the organic EL devices. Hence, the numbers of scans are preferably smaller. Nevertheless, the numbers of scans sometimes increase inevitably when thick layers need to be formed. Determining the numbers of scans on the safe side thus has an advantage of greater design flexibility.

EXAMPLE

Hereinafter, the present invention will be described in detail in conjunction with an example of embodiment. It should be noted that the present invention is not limited to the following example unless departing from the gist thereof. The luminescent layer and the electron transporting layer of the organic EL device in the example were formed by the fabrication method shown in FIGS. 3(a) and 3(b). The method will be described briefly again. The two moving evaporation sources, or the first evaporation source 62 for evaporating the material of the luminescent layer and the second evaporation source 64 for evaporating the material of the electron transporting layer, are opposed to each other below the glass substrate 10. Initially, the first evaporation source 62 is moved while the luminescent layer is evaporated. After the evaporation of the luminescent layer is completed, the second evaporation source 64 is moved while the electron transporting layer is evaporated.

This fabrication method is incorporated into a multi-chamber type fabrication system having a plurality of formation chambers. The luminescent layer of a predetermined color and the electron transporting layer are formed on the substrate in an identical formation chamber before the substrate is conveyed to another formation chamber to form a luminescent layer of another color.

Figure 4:
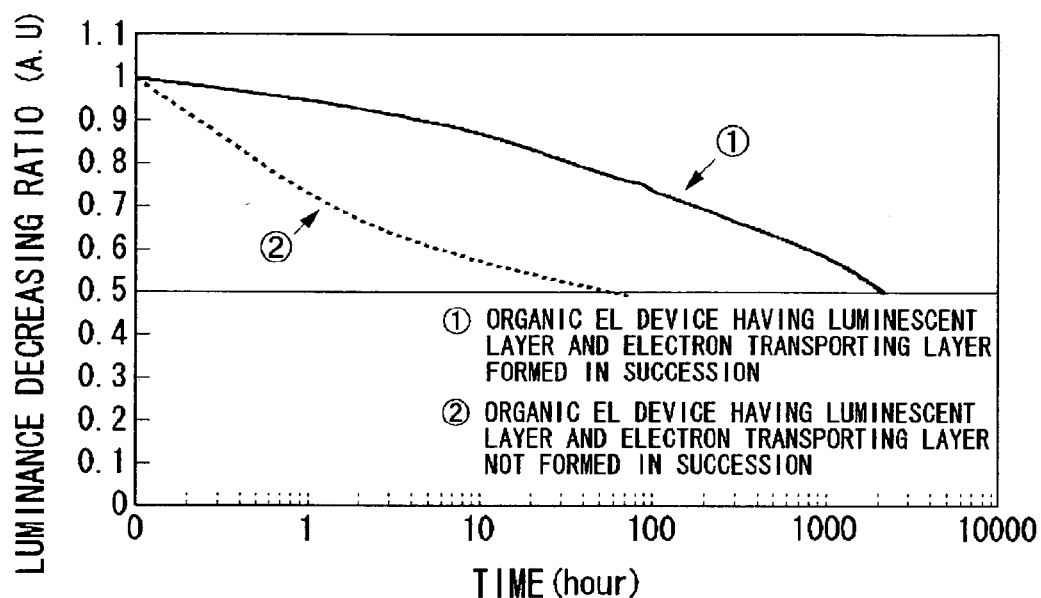
FIG. 4 is a chart showing time variations of luminance of an organic EL device having its luminescent layer and electron transporting layer formed in succession and an organic EL device having its luminescent layer and electron transporting layer not formed in succession.
Figure 5:
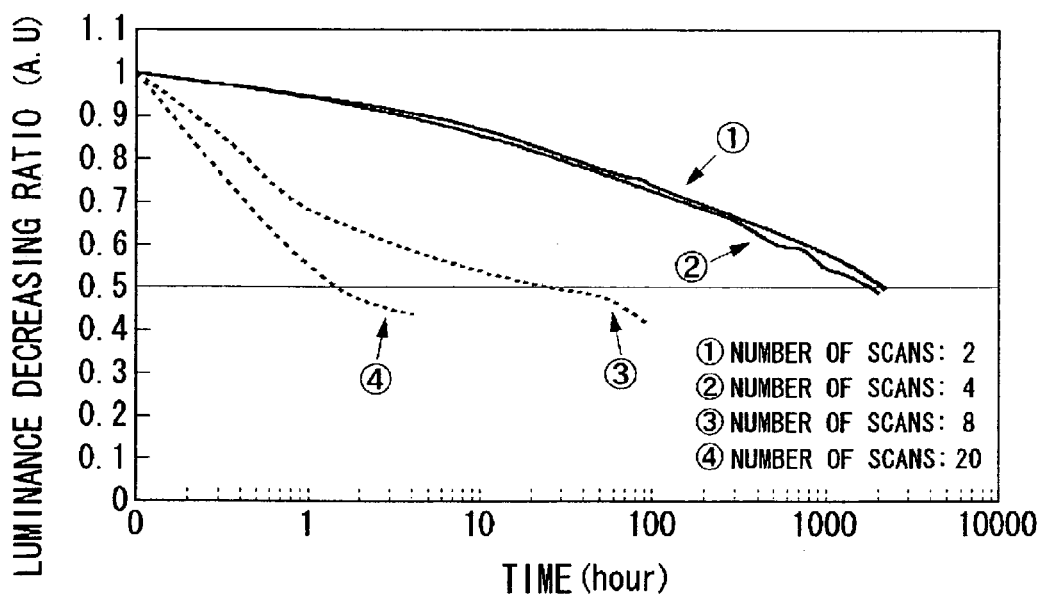
FIG. 5 is a chart showing time variations of luminance of organic EL devices with different numbers of scans of the moving evaporation sources in forming the electron transporting layer.

FIGS. 4 and 5 show experimental results on organic EL devices for emitting green luminescence. The numbers of scans of the evaporation sources were two, i.e., a single reciprocation. The host of the luminescent layer was Alq3, doped with 10% of the compound specified with the Formula 6 and 1% of quinacridone derivatives. The electron transporting layer was made of Alq3. The luminescent layer and the electron transporting layer both were 37.5 nm in thickness. The hole transporting layer was made of the compound specified with the Formula 1 and had a thickness of 150 nm. The temperatures for evaporating the materials were as follows: 340–350° C. for the compound specified with the Formula 1; 310–320° C. for Alq3; 210–220° C. for the compound specified with the Formula 6; and 220–230° C. for quinacridone derivatives. The formation chamber was approximately $2\times10^{-5}$ Pa in the degree of vacuum.

FIG. 4 shows time variations of luminance of an organic EL device having its luminescent layer and electron transporting layer formed in succession and an organic EL device having its luminescent layer and electron transporting layer not formed in succession. Here, the luminance is shown relative to the initial luminance. The organic EL devices were driven for luminescence by a constant current of 20 $mA/cm^2$ in current density with an initial luminance of 800 $cd/m^2$, and then measured for luminance. The luminance measurement shown in FIG. 5 was also conducted similarly.

The organic EL device having the electron transporting layer of non-successive formation decreased by half in luminance after approximately 50 hours. In contrast, the organic EL device having the electron transporting layer of successive formation took approximately 2000 hours to decrease by half in luminance. This shows a significant improvement in the characteristic.

FIG. 5 shows time variations of luminance with different numbers of scans of the moving evaporation sources in forming the electron transporting layer. Here, the numbers of scans were even numbers as mentioned above, because of the fabrication step in which the moving evaporation sources are returned to their initial positions. The two moving evaporation sources were made constant in speed irrespective of the numbers of scans.

With the numbers of scans of two and four, the luminance showed almost the same time variations, taking approximately 2000 hours to decrease by half. With the number of scan of eight, the luminance decreased by half after approximately 30 hours. With the number of scan of twenty, the luminance decreased by half after approximately 2 hours. From above, it is assumed that the numbers of scans are desirably equal to or below five, and preferably four or below.

Here, because of the constant speed of the evaporation sources, an increase in the number of scans lowers the evaporation rate of the material. As a result, it takes longer to form the electron transporting layer, causing interfaces and presumably increasing impurities mixed in the electron transporting layer. This seems to be the reason why an increase in the number of scans accelerates the progress of degradation of the organic EL devices.

As above, according to the example of embodiment, the luminescent layer and the electron transporting layer can be formed in an identical formation chamber in succession to suppress the mixing of impurities into the interface occurring between the luminescent layer and the electron transporting layer. It is therefore possible to reduce the degradation of the organic EL device ascribable to impurities lying on the interface.

Besides, the number of scans of the evaporation source in forming the electron transporting layer can also be decreased to eliminate interfaces occurring in the electron transporting layer. It is therefore possible to reduce the degradation of the organic EL device ascribable to impurities mixed in the interfaces.

According to the present invention, it is possible to eliminate interfaces occurring between the hole transporting layer and the luminescent layer and between the luminescent layer and the electron transporting layer, thereby reducing the degradation of the organic EL device ascribable to the interfaces. In another aspect, interfaces to occur inside the electron transporting layer can also be suppressed to reduce the degradation of the organic EL device ascribable to impurities mixed in the interfaces.

Although the present invention has been described by way of exemplary embodiments, it should be understood that many changes and substitutions may further be made by those skilled in the art without departing from the scope of the present invention which is defined by the appended claims.

What is claimed is:

1. A method of manufacturing an organic electroluminescent display having an organic electroluminescent device, comprising the steps of:

forming a luminescent layer and an electron transporting layer to be arranged on the luminescent layer in succession; wherein:

the luminescent layer and the electron transporting layer to be arranged on the luminescent layer are formed in vacuum by evaporation, in which time a first moving evaporation source for retaining and evaporating material of the luminescent layer and a second moving evaporation source for retaining and evaporating material of the electron transporting layer are placed below a substrate for the luminescent layer and the electron transporting layer to be formed on, and the first and second moving evaporation sources are relatively moved parallel with a surface of the substrate for the luminescent layer and the electron transporting layer to be formed on while the luminescent layer and the electron transporting layer are formed in succession;

the first and second moving evaporation sources are opposed to each other below the substrate so as to be capable of movement from one end of the substrate to the other;

the luminescent layer and the electron transporting layer are formed in succession by evaporating the materials retained in the first and second moving evaporation sources while the respective moving evaporation sources are moved by turns; and the first moving evaporation source moves from a first position displaced from the substrate along the direction of movement, and the second moving evaporation source moves from a second position opposite to the first position and displaced from the substrate along the direction of movement; and evaporating the materials retained in the first and the second moving evaporating sources while the respective moving evaporation sources are moved by turns to respectively make at least one reciprocal movement from one of the substrate to the other.

2. The method of manufacturing an organic electroluminescent display according to claim 1, wherein the electron transporting layer is formed within ten minutes after the formation of the luminescent layer.

3. The method of manufacturing an organic electroluminescent display according to claim 1, wherein the numbers of scans of the first and second moving evaporation sources are equal to or below five each, with a process of moving the first and second moving evaporation sources from one end of the substrate to the other as a single unit of scan.

4. The method of manufacturing an organic electroluminescent display according to claim 3, wherein:

the numbers of scans of the first and second moving evaporation sources are even numbers, respectively; and the first and second moving evaporation sources are returned to their respective initial positions when the scans of the first and second moving evaporation sources are completed.

5. The method of manufacturing an organic electroluminescent display according to claim 1, wherein:

the numbers of scans of the first and second moving evaporation sources are even numbers, respectively; and the first and second moving evaporation sources are returned to their respective initial positions when the scans of the first and second moving evaporation sources are completed.

6. A method of manufacturing an organic electroluminescent display having organic electroluminescent devices for emitting luminescence in a plurality of colors, comprising the steps of:

forming a luminescent layer and an electron transporting layer to be arranged on the luminescent layer in an identical formation chamber in succession with respect to each color; wherein:

the luminescent layer and the electron transporting layer to be arranged on the luminescent layer are formed in vacuum by evaporation, in which time a first moving evaporation source for retaining and evaporating material of the luminescent layer and a second moving evaporation source for retaining and evaporating material of the electron transporting layer are placed below a substrate for the luminescent layer and the electron transporting layer to be formed on, and the first and second moving evaporation sources are relatively moved parallel with a surface of the substrate for the luminescent layer and the electron transporting layer to be formed on while the luminescent layer and the electron transporting layer are formed in succession;

the first and second moving evaporation sources are opposed to each other below the substrate so as to be capable of movement from one end of the substrate to the other;

the luminescent layer and the electron transporting layer are formed in succession by evaporating the materials retained in the first and second moving evaporation sources while the respective moving evaporation sources are moved by turns; and the first moving evaporation source moves from a first position displaced from the substrate along the direction of movement, and the second moving evaporation source moves from a second position opposite to the first position and displaced from the substrate along the direction of movement; and evaporating the materials retained in the first and the second moving evaporating sources while the respective moving evaporation sources are moved by turns to respectively make at least one reciprocal movement from one of the substrate to the other.

7. The method of manufacturing an organic electroluminescent display according to claim 6, wherein the electron transporting layer is formed within ten minutes after the formation of the luminescent layer.

8. The method of manufacturing an organic electroluminescent display according to claim 6, wherein the numbers of scans of the first and second moving evaporation sources are equal to or below five each, with a process of moving the first and second moving evaporation sources from one end of the substrate to the other as a single unit of scan.

9. The method of manufacturing an organic electroluminescent display according to claim 8, wherein:

the numbers of scans of the first and second moving evaporation sources are even numbers, respectively; and the first and second moving evaporation sources are returned to their respective initial positions when the scans of the first and second moving evaporation sources are completed.

10. The method of manufacturing an organic electroluminescent display according to claim 6, wherein:

the numbers of scans of the first and second moving evaporation sources are even numbers, respectively; and the first and second moving evaporation sources are returned to their respective initial positions when the scans of the first and second moving evaporation sources are completed.

* * * * *